US009824946B2

(12) United States Patent
Byun et al.

(10) Patent No.: US 9,824,946 B2
(45) Date of Patent: Nov. 21, 2017

(54) TEST ARCHITECTURE OF SEMICONDUCTOR DEVICE, TEST SYSTEM, AND METHOD OF TESTING SEMICONDURCTOR DEVICES AT WAFER LEVEL

(71) Applicant: Samsung Electronics Co., Ltd., Suwon-si (KR)

(72) Inventors: Young-Yong Byun, Seoul (KR); Ho-Sung Song, Seoul (KR); Chi-Wook Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/231,862

(22) Filed: Aug. 9, 2016

(65) Prior Publication Data

US 2017/0170081 A1    Jun. 15, 2017

(30) Foreign Application Priority Data

Dec. 14, 2015 (KR) .......................... 10-2015-0177919

(51) Int. Cl.
| | |
|---|---|
| H01L 21/66 | (2006.01) |
| H01L 21/78 | (2006.01) |
| H01L 23/544 | (2006.01) |
| G01R 31/28 | (2006.01) |

(52) U.S. Cl.
CPC .......... *H01L 22/34* (2013.01); *G01R 31/2884* (2013.01); *G01R 31/2894* (2013.01); *H01L 21/78* (2013.01); *H01L 22/14* (2013.01); *H01L 23/544* (2013.01); *H01L 2223/5446* (2013.01)

(58) Field of Classification Search
CPC ........ G01R 31/2884; G01R 31/318511; G01R 31/2853; G01R 31/2894; H01L 25/0655; H01L 22/34; H01L 22/14; H01L 23/544; H01L 21/78; H01L 2223/5446
See application file for complete search history.

(56) References Cited

U.S. PATENT DOCUMENTS

| | | | | |
|---|---|---|---|---|
| 6,121,677 | A | * | 9/2000 | Song ........................ H01L 22/32 257/48 |
| 6,399,400 | B1 | * | 6/2002 | Osann, Jr. ............... H01L 22/20 257/E21.525 |
| 6,885,212 | B2 | | 4/2005 | Yamamoto et al. |
| 7,221,170 | B2 | | 5/2007 | Lee et al. |
| 7,888,808 | B2 | | 2/2011 | Suzuki et al. |
| 8,941,403 | B2 | | 1/2015 | Chang et al. |

(Continued)

FOREIGN PATENT DOCUMENTS

| | | |
|---|---|---|
| KR | 10-0259172 B1 | 6/2000 |
| KR | 10-0594204 B1 | 6/2006 |
| KR | 10-2008-0073577 A | 8/2008 |

*Primary Examiner* — Caridad Everhart
(74) *Attorney, Agent, or Firm* — Muir Patent Law, PLLC

(57) ABSTRACT

A method of manufacturing a semiconductor chip from a wafer having a test architecture includes forming a plurality of dies on a wafer, each of the plurality of dies including a semiconductor device, forming at least two common pads commonly coupled to the dies, the at least two common pads being formed in a scribe lane, the scribe lane distinguishing the dies with respect to each other, and simultaneously testing the semiconductor devices at a wafer level, using the at least two common pads.

19 Claims, 17 Drawing Sheets

(56) References Cited

U.S. PATENT DOCUMENTS

| | | | | |
|---|---|---|---|---|
| 2005/0026315 A1* | 2/2005 | Cowles | ............. | G01R 31/2884 438/18 |
| 2010/0117678 A1* | 5/2010 | Nakabayashi | ..... | G01R 31/2884 324/762.05 |
| 2013/0299947 A1* | 11/2013 | Uehling | ................. | H01L 22/20 257/620 |

* cited by examiner

90a

90b

TEST ARCHITECTURE OF SEMICONDUCTOR DEVICE, TEST SYSTEM, AND METHOD OF TESTING SEMICONDURCTOR DEVICES AT WAFER LEVEL

CROSS-REFERENCE TO RELATED APPLICATION(S)

This US application claims the benefit of priority under 35 USC §119 to Korean Patent Application No. 10-2015-0177919, filed on Dec. 14, 2015, in the Korean Intellectual Property Office, the content of which is incorporated in its entirety by reference herein.

BACKGROUND

1. Technical Field

Example embodiments relate to semiconductor devices, and more particularly to a test architecture of semiconductor devices, test systems, and methods of testing semiconductor devices at a wafer level.

2. Discussion of the Related Art

In general, a semiconductor device formed on a semiconductor substrate made of, for example, silicon, is formed through a series of unit processes, including a film stacking process, impurity doping process, a photolithography process for patterning films, and an etching process. In order to determine whether each unit process has accurately been performed to be adapted to the design, failures of manufactured semiconductor devices, including transistors, capacitors, resistors, inductors, and so on, are detected or parameter characteristics thereof are evaluated whenever the unit process is completed.

When a test is performed on the semiconductor device at a wafer level, the test is performed on a wafer on which a plurality of semiconductor devices are formed, a test time required to perform the test at a wafer level increases as a number of the semiconductor devices formed on the wafer increases.

SUMMARY

Some example embodiments may provide a test architecture of a semiconductor device, capable of reducing time required for testing semiconductor devices on a wafer.

Some example embodiments may provide a test system, capable of reducing time required for testing semiconductor devices on a wafer.

Some example embodiments may provide a method of testing semiconductor devices at a wafer level, capable of reducing time required for testing the semiconductor devices.

According to some example embodiments, a method of manufacturing a semiconductor chip from a wafer having a test architecture is disclosed. The method includes forming a plurality of dies on a wafer, each of the plurality of dies including a semiconductor device. The method further includes forming at least two common pads commonly coupled to the dies, the at least two common pads being formed in a scribe lane, the scribe lane distinguishing the dies with respect to each other. The method further includes simultaneously testing the semiconductor devices at a wafer level, using the at least two common pads.

According to some example embodiments, a method of manufacturing a semiconductor chip includes: providing a wafer including a plurality of dies including a first die used to form the semiconductor chip, and a plurality of test pads formed in scribe regions between the plurality of dies; forming a plurality of test circuits connected to the plurality of test pads; using the plurality of test pads and plurality of test circuits to simultaneously test a plurality of the dies; and singulating the dies from each other by cutting along the scribe regions. The plurality of test pads and/or at least part of the plurality of test circuits are removed during the singulation and are not included in the singulated dies.

According to some example embodiments, a method of testing separate semiconductor devices formed in respective dies formed on a wafer at a wafer level includes: transferring test operating signals from an external test equipment commonly to the semiconductor devices through a plurality of common pads and a plurality of input buffers connected to the common pads respectively, and providing test result signals from the semiconductor devices to the automated test equipment through at least one of the input buffers and at least one of the common pads, in response to a test pattern signal of the test operating signals. The common pads are formed in a scribe lane that distinguishes the dies with respect to each other and the common pads are connected commonly to the dies.

Accordingly, since test operating signals are simultaneously applied to dies using common pads formed in a scribe lane, an increase of time required for test may be prevented or reduced even when a number of dies formed in a wafer increases.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
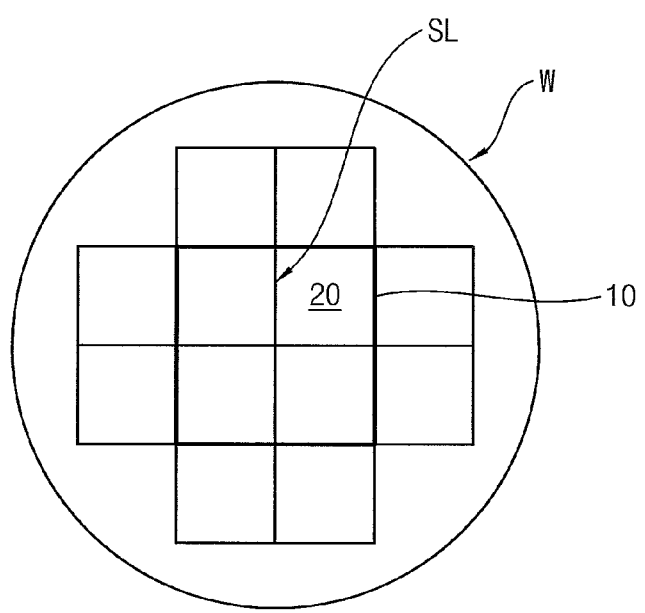
FIG. 1 is a schematic plan view of a wafer W on which a plurality of semiconductor devices are formed.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 2:
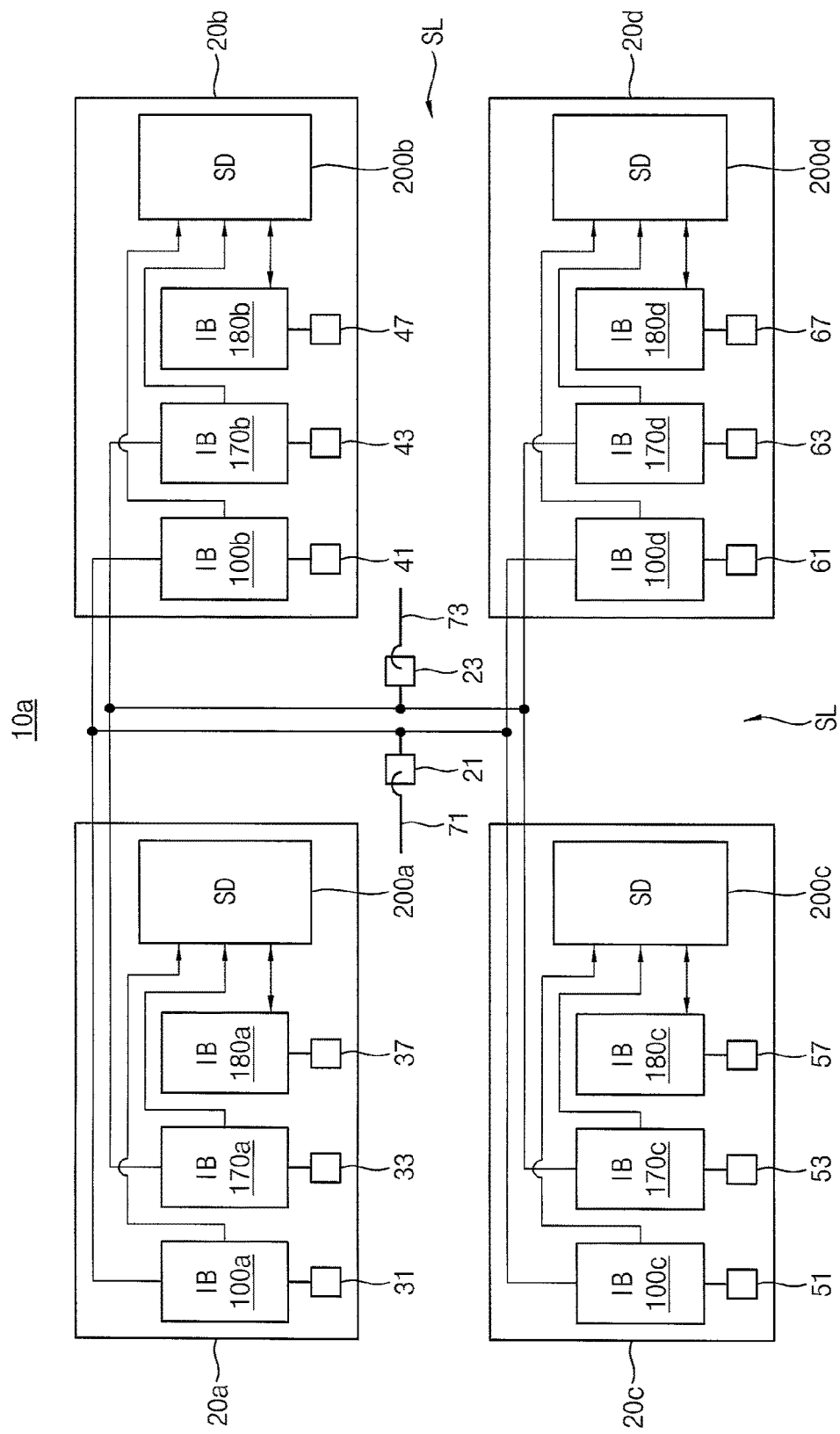
FIG. 2 is an enlarged plan view of a portion 10 of FIG. 1, according to example embodiments.

FIG. 1 is a schematic plan view of a wafer W on which a plurality of semiconductor devices are formed. FIG. 2 is an enlarged plan view of a portion 10 of FIG. 1, according to example embodiments. As used herein, a semiconductor device may refer, for example, to a device such as a semiconductor chip (e.g. a die including an integrated circuit formed from a wafer), and may also generally refer to electronic devices that include such a chip, such as a stack of semiconductor chips, a semiconductor package including one or more semiconductor chips stacked on a package substrate, or a package-on-package device including a plurality of packages. A semiconductor device may also refer to a part of a semiconductor chip, such as a memory cell array and associated logic circuits for performing memory operations such as read, write, and erase.

Referring to FIGS. 1 and 2, a plurality of dies 20 are formed on a wafer W using a fabrication (FAB) process. The dies 20 are separated (or singulated) by a scribe lane SL and manufactured as independent units of chips based on an assembly process. The scribe lane SL may be also referred to as a scribe line. A scribe lane, or scribe line, refers to an area where cutting occurs in order to singulate dies from each other. For example, circuits included in the scribe lane may no longer function the same way after the dies are singulated, as the circuits may either be removed, or cut to render certain components floating and/or non-operational.

After completion of the FAB process and prior to the assembly process, a test procedure may be performed for testing various electrical properties of the dies 20 that are formed on the wafer W. This test procedure may include, for example, an electrical die sorting (EDS) process. Hereinafter, the EDS process will be described in detail. However, the inventive concepts are not limited to use in an EDS process, and other tests for testing whether the semiconductor devices DIE are faulty may also be applied using the techniques disclosed herein.

During the EDS process, an electrical signal is applied to the dies 20 that are formed on the wafer W. In response to this signal, the dies 20 transmit output signals. These output signals are used to determine if one or more of the dies 20 are faulty. In the EDS process, an automated test equipment (ATE) generates one or more test operating signals, and transmits the test operating signals to the dies 20 via a probe card. The dies 20 transmit test result signals responding to the test operating signals to the ATE via the probe card and the ATE determines whether each of the dies 20 is faulty.

Due to improvements in semiconductor device manufacturing technology, semiconductor devices are being reduced in size, and accordingly, a number of dies formed on a wafer increases. Since the ATE has a limited number of probe cards, a number of dies which are simultaneously tested is limited by the number of probe cards. Therefore, a time required for testing semiconductor devices formed on one wafer may increase as a number of dies formed in the one wafer increases.

Referring to FIG. 2, the portion 10 of the wafer W may include a plurality of dies 20a, 20b, 20c and 20d and a scribe lane SL that distinguishes the plurality of dies 20a, 20b, 20c and 20d. The plurality of dies 20a, 20b, 20c and 20d may be formed on an upper surface of the wafer W (e.g., integrated circuits formed on the wafer substrate may be formed at an upper surface of the wafer W), and each of the plurality of dies 20a, 20b, 20c and 20d may be configured to perform respective functions independently (e.g., as part of a separated semiconductor device).

At least two common pads 21 and 23 may be formed in scribe lane SL, and the least two common pads 21 and 23 may be used for testing the wafer W. The term "pad" generally refers to a conductive terminal having a flat surface profile, and often formed in a layer deposition and patterning process, and which typically connects to internal circuitry (e.g., an integrated circuit) or conductive lines of a substrate or semiconductor chip on which it is formed.

The die 20a may include at least two chip pads 31, 33 and 37, at least two input buffers 100a, 170a and 180a and a semiconductor device 200a. The die 20b may include at least two chip pads 41, 43 and 47, at least two input buffers 100b, 170b and 180b and a semiconductor device 200b. The die 20c may include at least two chip pads 51, 53 and 57, at least two input buffers 100c, 170c and 180c and a semiconductor device 200c. The die 20d may include at least two chip pads 61, 63 and 67, at least two input buffers 100d, 170d and 180d and a semiconductor device 200d.

Each of the chip pads 31, 33 and 37 may be connected to corresponding one of the input buffers 100a, 170a and 180a, and the input buffers 100a, 170a and 180a may be connected to the semiconductor device 200a. Each of the chip pads 41, 43 and 47 may be connected to corresponding one of the input buffers 100b, 170b and 180b, and the input buffers 100b, 170b and 180b may be connected to the semiconductor device 200b. Each of the chip pads 51, 53 and 57 may be connected to corresponding one of the input buffers 100c, 170c and 180c, and the input buffers 100c, 170c and 180c may be connected to the semiconductor device 200c. Each of the chip pads 61, 63 and 67 may be connected to corresponding one of the input buffers 100d, 170d and 180d, and the input buffers 100d, 170d and 180d may be connected to the semiconductor device 200d.

Each of the semiconductor devices 200a, 200b, 200c and 200d may be a semiconductor memory device such as a DRAM or an MRAM configured to perform respective functions independently from each other. For example, in response to one or more signals received separately or in common, each semiconductor memory device may perform its own functions regardless of the functions being performed by other of the semiconductor memory devices. As described previously, though the term "semiconductor device" may be used herein to refer to a chip, or package, it may also be used to refer to a part of a chip or package that performs certain operations, such as memory operations. Therefore, a semiconductor memory device may refer to portions of a chip or package that perform memory operations.

The first common pad 21 may be commonly connected to the input buffers 100a, 100b, 100c and 100d and the second common pad 23 may be commonly connected to the input buffers 170a, 170b, 170d and 170d.

When the wafer W is tested, a probe card 71 may contact the first common pad 21 and a probe card 73 may contact the second common pad 23. A command signal from the probe card 71 may be simultaneously applied to the input buffers 100a, 100b, 100c and 100d through the first common pad 21 and an address signal from the probe card 73 may be simultaneously applied to the input buffers 170a, 170b, 170c and 170d through the second common pad 23. In addition, test pattern signals may be applied to the input buffers 180a, 180b, 180c and 180d through the chip pads 37, 47, 57 and 67 respectively when the wafer W is tested.

The input buffers 100a and 170a in the die 20a transfer test operation signals such as a command signal and an address signal from the ATE and via the common pads 21 and 23 to the semiconductor device 200a and cut off a path through the chip pads 31 and 33, the input buffers 100b and 170b in the die 20b transfer the test operation signals from the ATE and via the common pads 21 and 23 to the semiconductor device 200b and cut off a path through the chip pads 41 and 43, the input buffers 100c and 170c in the die 20c transfer the test operation signals from the ATE and via the common pads 21 and 23 to the semiconductor device 200c and cut off a path through the chip pads 51 and 53, and the input buffers 100b and 170b in the die 20b transfer the test operation signals from the ATE and via the common pads 21 and 23 to the semiconductor device 200d and cut off a path through the chip pads 61 and 63 when the wafer W is tested.

Figure 3:
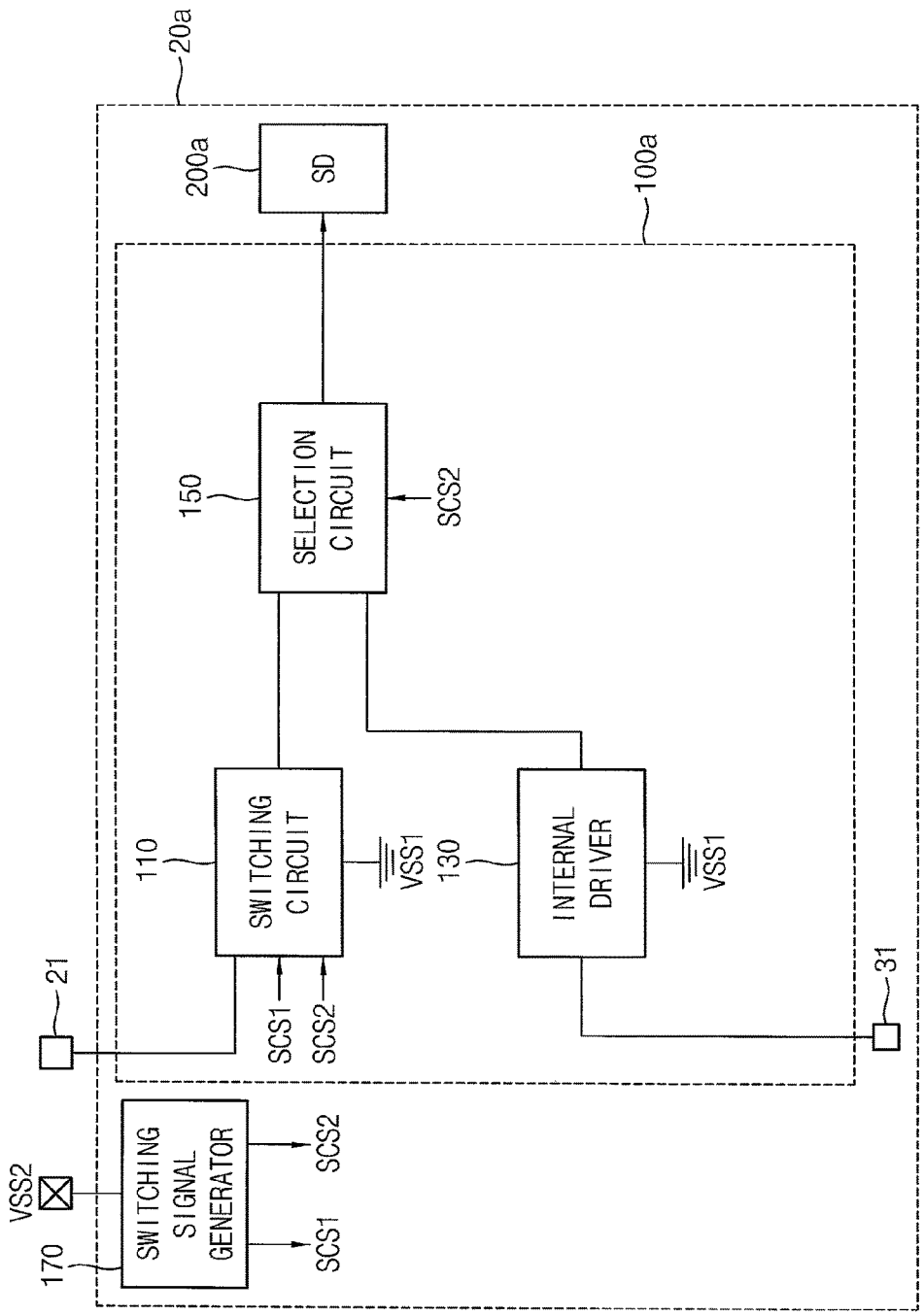
FIG. 3 is a block diagram illustrating one of the dies in the wafer of FIG. 2 according to example embodiments.

FIG. 3 is a block diagram illustrating one of the dies in the wafer of FIG. 2 according to example embodiments.

FIG. 3 illustrates the first input buffer 100 of the input buffers 100a and 170a.

Referring to FIG. 3, the die 20a includes the semiconductor device 200a and the input buffer 100a. The input buffer 100a includes a switching circuit 110, an internal driver 130 and a selection circuit 150. The die 20a may further include a switching signal generator 170.

The switching circuit 110 is connected to the first common pad 21 and a first ground pad VSS1 in the die 20a and outputs one of the test operating signals via the first common pad 21 and a ground voltage from the first ground pad VSS1 in response to a first switching control signal SCS1 and a second switching control signal SCS2. The internal driver 130 is connected to the chip pad 31 and the first ground pad VSS1. The selection circuit 150 is connected to the switching circuit 110 and the internal driver 130 and provides the semiconductor device 200a with one of an output of the switching circuit 110 and an output of the internal driver 130 in response to the second switching control signal SCS2.

When the semiconductor device 200a is tested at a wafer level, the switching circuit 110 outputs the test operation signals from the common pad 21 in response to the first switching control signal SCS1 and the second switching control signal SCS2 and the selection circuit 150 provides the semiconductor device 200a with the output of the switching circuit 110 in response to the second switching control signal SCS2.

Although a configuration of the second input buffer 170a is not illustrated in FIG. 3, the configuration of the second input buffer 170a may be substantially the same as a configuration of the first input buffer 100a.

Figure 4:
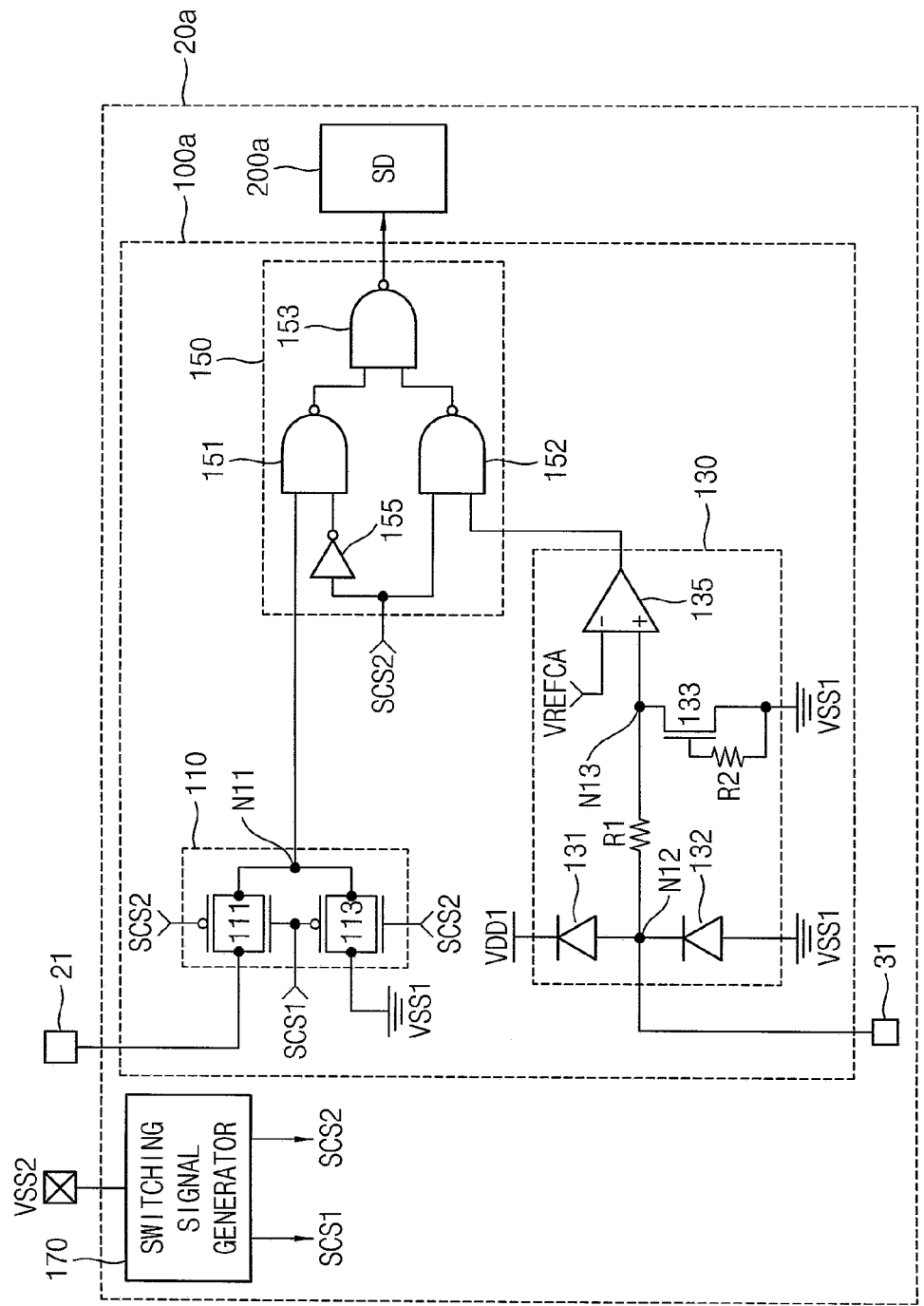
FIG. 4 illustrates a configuration of the first input buffer in FIG. 3 according to example embodiments.

FIG. 4 illustrates a configuration of the first input buffer in FIG. 3 according to example embodiments.

Referring to FIG. 4, the switching circuit 110 in the first input buffer 100a includes a first transmission gate 111 and a second transmission gate 113.

The first transmission gate 111 is connected between the first common pad 21 and a first node N11 connected to the selection circuit 150 and receives the first switching control signal SCS1 and the second switching control signal SCS2. The second transmission gate 113 is connected between the first ground pad VSS1 and the first node N11 and receives the first switching control signal SCS1 and the second switching control signal SCS2.

The internal driver 130 includes diodes 131 and 132, a resistor R1, an NMOS transistor 133, a resistor R2 and an operational amplifier 135.

The diode 131 is connected between a power pad VDD1 in the die 20a and a second node N12 connected to the chip pad 31, and the diode 132 is connected between the second node N12 and the first ground pad VSS1. The resistor R1 is connected between the second node N12 and a third node N13. The NMOS transistor 133 is connected between the third node N13 and the first ground pad VSS1 and the resistor R2 is connected between a gate of the NMOS transistor 133 and the first ground pad VSS1. The operational amplifier 135 has a positive input terminal connected to the third node N13, a negative input terminal connected to the reference voltage VREFCA and an output terminal connected to the selection circuit 150.

The internal driver 130 may cut off a noise that flows in through the chip pad 31 when the die 20 is tested at a wafer level.

The selection circuit 150 includes NAND gates 151, 152 and 153 and an inverter 155. The inverter 155 inverts the second switching control signal SCS2. The NAND gate 151 performs a NAND operation on the output of the switching circuit 110 and an output of the inverter 155. The NAND gate 152 performs a NAND operation on the second switching control signal SCS2 and an output of the internal driver 130. The NAND gate 153 performs a NAND operation on the outputs of the NAND gates 151 and 152 to provide its output to the semiconductor device 200a.

The switching signal generator 170 is connected to a second ground pad VSS2 in the scribe lane SL and generates the first switching control signal SCS1 and the second switching control signal SCS2 based on a voltage of the second ground pad VSS2. The switching signal generator 170 provides the first switching control signal SCS1 and the second switching control signal SCS2 to the first input buffer 100a.

In one embodiment, when the semiconductor device 200a is tested at a wafer level, the first switching control signal SCS1 is enabled at a first logic level (e.g., logic high) and the second switching control signal SCS2 is disabled at a second logic level (e.g., logic low). Therefore, when the semiconductor device 200a is tested at a wafer level using these inputs, the first transmission gate 111 is turned-on and the second transmission gate 113 is turned-off and the switching circuit 110 outputs the test operating signals through the first common pad 21 to the selection circuit 150.

When the semiconductor device 200a is tested at a wafer level according to this embodiment, the second switching control signal SCS2 is disabled at the second logic level and the output of the inverter 155 has a first logic level. Therefore, the NAND gate 151 inverts the output of the switching circuit 110. Since the output of the NAND gate 151 has a first logic level irrespective of the output of the internal driver 130, the NAND gate 153 inverts the output of the NAND gate 151. Therefore, when the semiconductor device 200a is tested at a wafer level for this embodiment, the output of the switching circuit 110 may be provided as the output of the NAND gate 153.

When the test on the dies 20a~20d in FIG. 1 is completed at a wafer level and the dies 20a~20d are separated with respect to the scribe lane SL, the common pads 21 and 23 and the second ground pad VSS2 are also separated and a voltage connected to the switching signal generator 170 floats. When the voltage connected to the switching signal generator 170 floats, the first switching control signal SCS1 is disabled at a second logic level (e.g., logic low) and the second switching control signal SCS2 is enabled at a first logic level (e.g., logic high). Therefore, when the dies 20a~20d are separated with respect to the scribe lane SL, the switching circuit 110 provides the selection circuit 150 with the ground voltage from the first ground pad VSS1. Therefore, the selection circuit 150 provides the semiconductor device 200a with signals via the chip pad 31 and the internal driver 130. In this manner, according to one embodiment, the selection circuit selects between inputting test signals between a wafer test pad and the semiconductor device 200a and inputting data signals between chip pads and the semiconductor device 200a.

Figure 5:
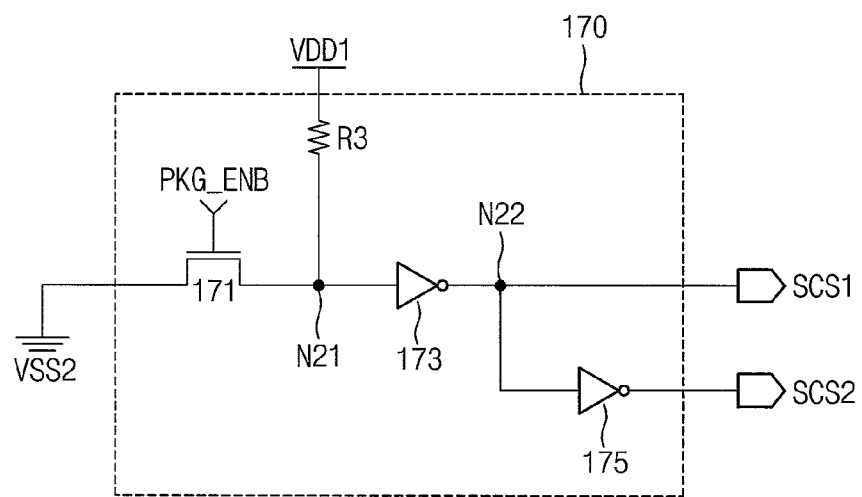
FIG. 5 illustrates the switching signal generator in the die of FIG. 4 according to example embodiments.

FIG. 5 illustrates the switching signal generator in the die of FIG. 4 according to example embodiments.

Referring to FIG. 5, the switching signal generator 170 includes an NMOS transistor 171, a resistor R3 and inverters 173 and 175.

The NMOS transistor 171 is connected between the second ground pad VSS2 and a node N21. The resistor R3 is connected between the first power pad VDD1 in the scribe lane SL and the node N21. The inverter 173 inverts a voltage at the node N21 to output the first switching control signal SCS1. The inverter 175 is connected to a node N22, an output of the inverter 173, and inverts a voltage of the node N22 to output the second switching control signal SCS2.

A control signal PKG_ENB is applied to a gate of the NMOS transistor 171. The control signal PKG_ENB may be enabled at a first logic level when the wafer W is tested. The control signal may also be referred to as a wafer test enable signal, which can be enabled at the first logic level (e.g., a logic high level), and disabled at a second logic level (e.g., a logic low level).

When the wafer W is tested, the NMOS transistor 171 is turned-on in response to the control signal PKG_ENB, the inverter 173 outputs the first switching control signal SCS1 by inverting the ground voltage of the second ground pad VSS2 and the inverter 175 outputs the second switching control signal SCS2 by inverting the output of the inverter 173. When the wafer W is tested, the first switching control signal SCS1 has a first logic level and the second switching control signal SCS2 has a second logic level.

When the test on the dies 20a~20d in FIG. 1 is completed at a wafer level and the dies 20a~20d are separated with respect to the scribe lane SL, an input of the inverter 173 floats by the resistor R3, and first switching control signal SCS1 has a second logic level and the second switching control signal SCS2 has a first logic level.

The switching signal generator 170 provides the input buffers 100a and 170a with the first switching control signal SCS1 and the second switching control signal SCS2. In addition, the switching signal generator 170 provides the input buffer 180a with the first switching control signal SCS1 and the second switching control signal SCS2. In this case, the input buffer 180a receives the second switching control signal SCS2 instead of the first switching control signal SCS1 and the first switching control signal SCS1 instead of the second switching control signal SCS2 (e.g., it receives an inverse of the levels of signals for SCS1 and SCS2 received by input buffers 100a and 170a). When the input buffer 180a receives the second switching control signal SCS2 instead of the first switching control signal SCS1 and the first switching control signal SCS1 instead of the second switching control signal SCS2, the semiconductor device 200a may receive an output of an internal driver of the input buffer 180a when the wafer W is tested.

Figure 6:
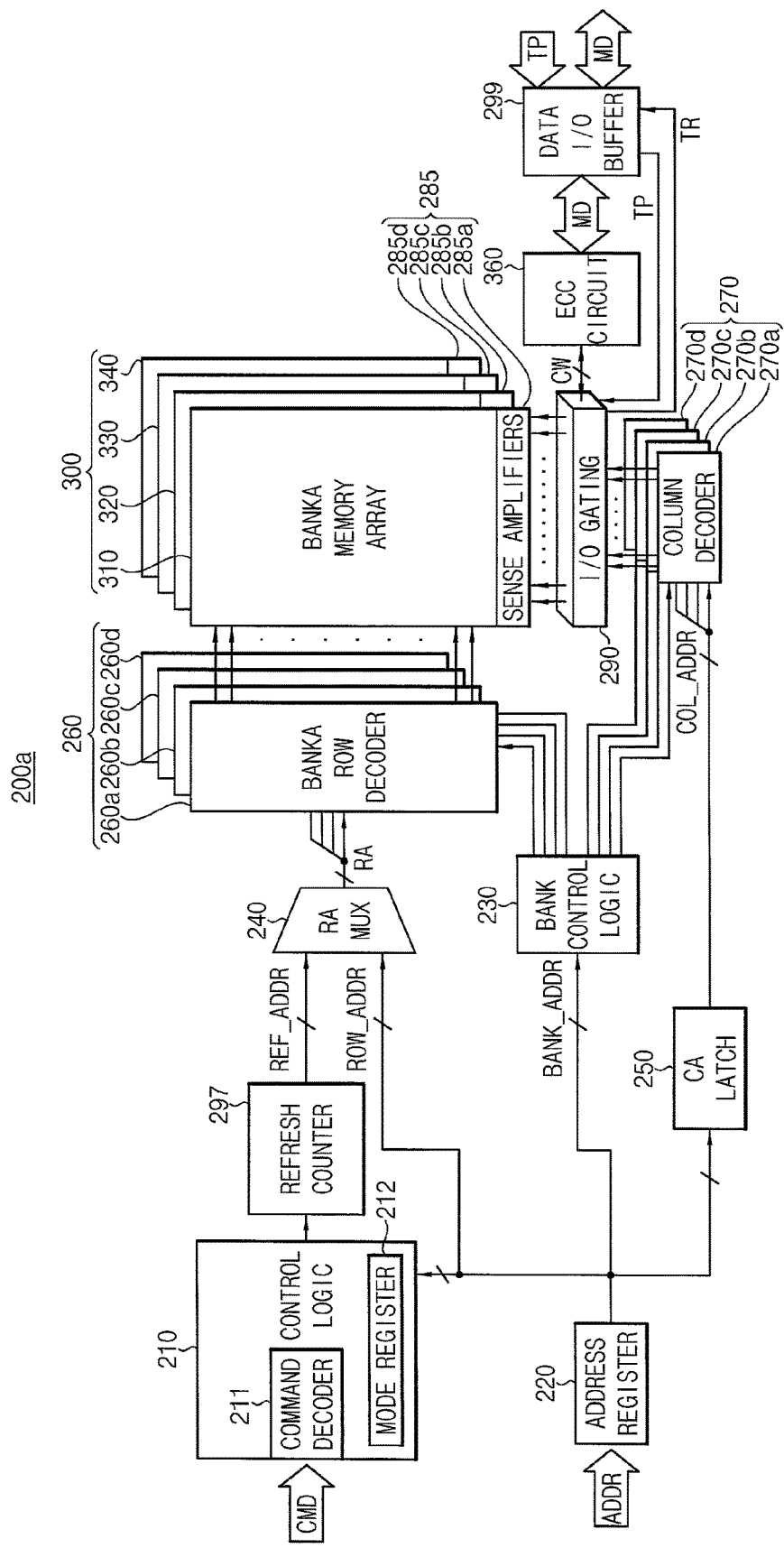
FIG. 6 is a block diagram illustrating the semiconductor device in the die of FIG. 3 according to example embodiments.

FIG. 6 is a block diagram illustrating the semiconductor device in the die of FIG. 3 according to example embodiments.

In FIG. 6, it is assumed that the semiconductor device 200a of FIG. 3 is implemented with a dynamic random access memory (DRAM). However, this is just one example, and various other types of semiconductor devices that are part of a semiconductor chip of a wafer can be tested using the circuits and methods described herein.

Referring to FIG. 6, the semiconductor memory device 200a may include a control logic 210, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, an error correction circuit 360, and a data input/output (I/O) buffer 299.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~285d respectively coupled to the first through fourth bank arrays 310~340. The first through fourth bank arrays 310~340, the first through fourth bank row decoders 260a~260d, the first through fourth bank column decoders 270a~270d and first through fourth bank sense amplifiers 285a~285d may form first through fourth banks. Although the semiconductor memory device 200a is illustrated in FIG. 6 as including four banks, the semiconductor memory device 200a may include any number of banks.

The address register 220 may receive an address ADDR including a bank address BANK_ADDR, a row address ROW_ADDR and a column address COL_ADDR from a memory controller. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array under control of the control logic 210.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through fourth bank arrays 310~340, and write drivers for writing data to the first through fourth bank arrays 310~340.

Codeword CW to be read from one bank array of the first through fourth bank arrays 310~340 may be sensed by a sense amplifier coupled to the one bank array from which the data is to be read, and may be stored in the read data latches. The codeword CW stored in the read data latches may be provided to the memory controller via the error correction circuit 360 and the data I/O buffer 299. Main data MD to be written in one bank array of the first through fourth bank arrays 310~340 may be provided to the data I/O buffer 299 from the memory controller. The main data MD provided to the data I/O buffer 299 is encoded to the codeword CW in the error correction circuit 360. The write driver may write the codeword CW in one bank array of the first through fourth bank arrays 310~340.

The data I/O buffer 299 receives test pattern data TP from the ATE when the wafer W is tested, provides the test pattern data TP to the I/O gating circuit 290. The I/O gating circuit 290 writes the test pattern data TP to a target page of the memory cell array 300 and reads the test pattern data TP from the target page to provide test result data TR to the data I/O buffer 299 when the wafer W is tested.

After the dies 20a~20d are separated, the error correction circuit 360 generates parity data based on the main data MD including a plurality of unit data from the data I/O buffer 299 in a write operation, and provides the I/O gating circuit 290 with the codeword CW including the main data MD and the parity data. The I/O gating circuit 290 writes the codeword CW to the target page of the memory cell array 300. In addition, in a read operation, the ECC circuit 360 receives the codeword CW which is read from the target page from the I/O gating circuit 290.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc.

Figure 7:
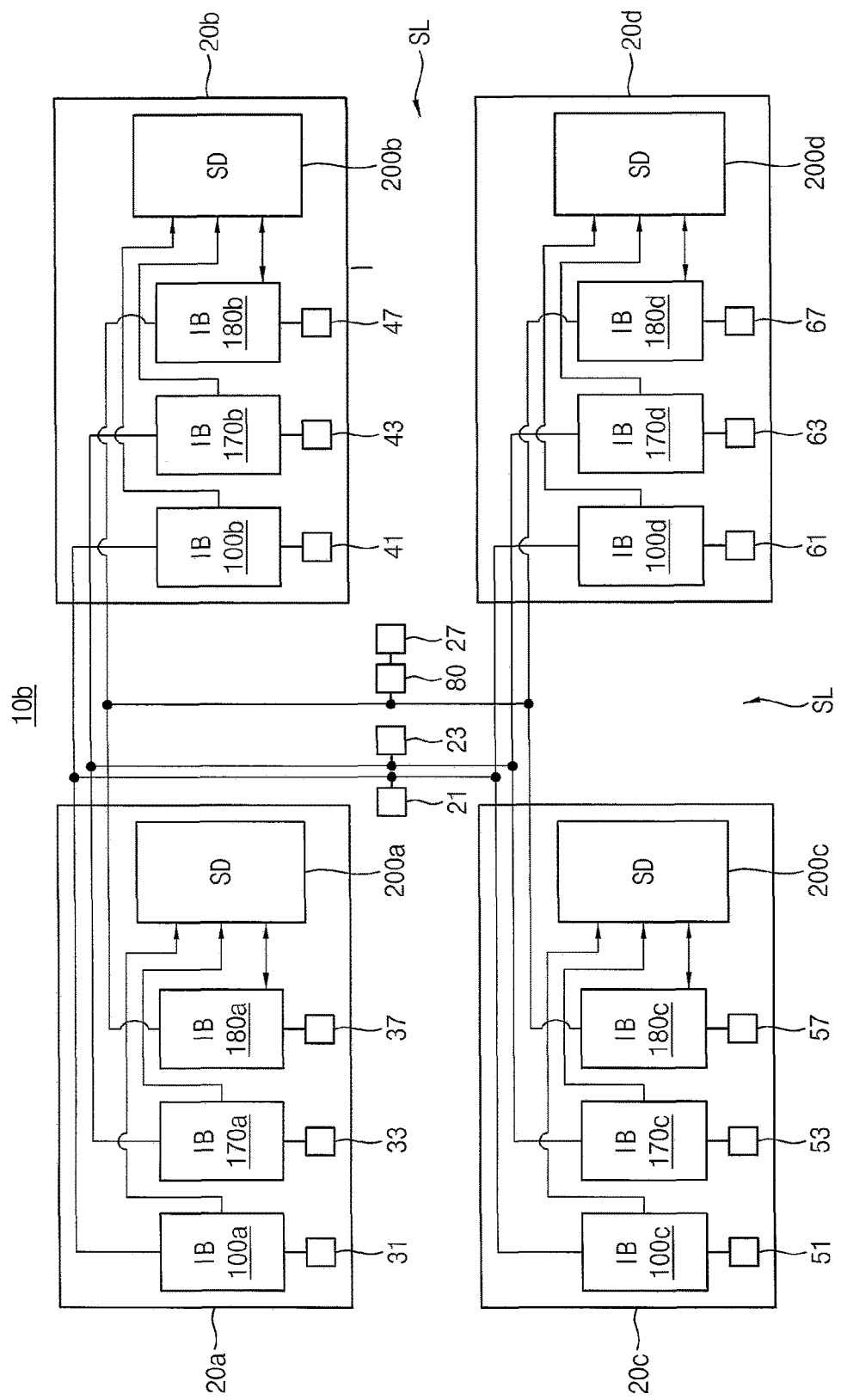
FIG. 7 is another enlarged plan view of a portion of FIG. 1, according to example embodiments.

FIG. 7 is another enlarged plan view of a portion of FIG. 1, according to example embodiments.

A portion 10b of the wafer W of FIG. 7 is different from the portion 10a of the wafer W of FIG. 2 in that the portion 10b of the wafer W further includes a common pad 27 and a data buffer 80 connected to the common pad 27 and the data buffer 80 is commonly connected to the input buffers 180a, 180b, 180c and 180d in each of the dies 20a, 20b, 20c and 20d.

When the wafer W is tested, the command signal and the address signal are commonly applied to the dies 20a, 20b, 20c and 20d through the common pads 21 and 23 in FIG. 2 while the command signal, the address signal and the test pattern signal are commonly applied to the dies 20a, 20b, 20c and 20d through the common pads 21, 23 and 27 in the embodiment of FIG. 7. As described herein, signals such as command signals and address signals are generally described as data control signals, and test pattern signals and normal data signals (e.g., normal data signals being signals used after testing and singulation during operation of the semiconductor chip) are described as data i/o signals.

For example, when the wafer W is tested, the command signal and the address signal are commonly applied to the dies 20a, 20b, 20c and 20d through the common pads 21 and 23 and the test pattern signal is respectively applied to the dies 20a, 20b, 20c and 20d through each of the chip pads 37, 47, 57 and 67 in FIG. 2 while the test pattern signal is commonly applied to the dies 20a, 20b, 20c and 20d through the common pad 27 in the embodiment of FIG. 7.

Referring to FIG. 7, the data buffer 80 is connected to the common pad 27 and the data buffer 80 is commonly connected to the input buffers 180a, 180b, 180c and 180d in each of the dies 20a, 20b, 20c and 20d. The data buffer 80 transfers the test pattern signal to the semiconductor devices 200a, 200b, 200c and 200d and transfers the test result signal responding to the test pattern signal to the ATE through each of the input buffers 180a, 180b, 180c and 180d and the common pad 27.

In this case, the switching signal generator 170 of FIG. 5 commonly applies the first switching control signal SCS1 and the second switching control signal SCS2 to the input buffers 100a, 170a and 180a.

Figure 8:
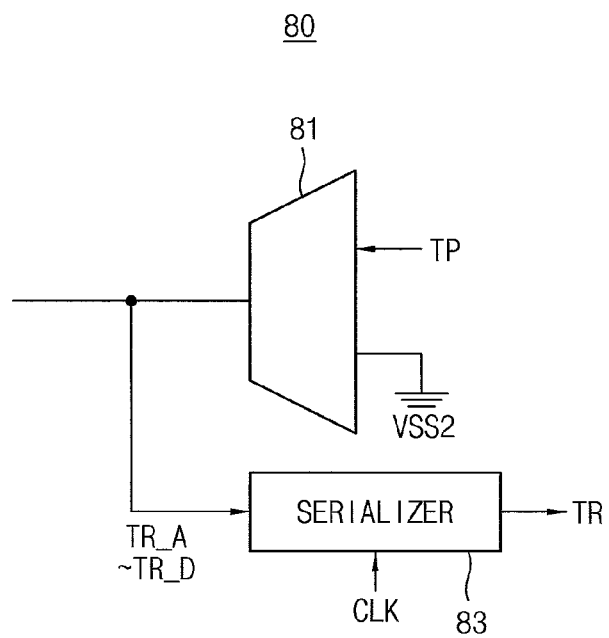
FIG. 8 illustrates a configuration of the data buffer in FIG. 7 according to example embodiments.

FIG. 8 illustrates a configuration of the data buffer in FIG. 7 according to example embodiments.

Referring to FIG. 8, the data buffer 80 includes a multiplexer 81 and a serializer 83.

The multiplexer 81 has a first input receiving a test pattern signal TP and a second input connected to the second ground pad VSS2. Therefore, the multiplexer 81 may provide the test pattern signal TP to the input buffers 180a, 180b, 180c and 180d. The serializer 83 may serialize the test result signals TR_A~TR_D based on a clock signal CLK and provide the ATE with a serialized test result signal TR through the common pad 27. The test result signals TR_A~TR_D are simultaneously provided to the serializer 83 from the semiconductor devices 200a, 200b, 200c and 200d.

Figure 9:
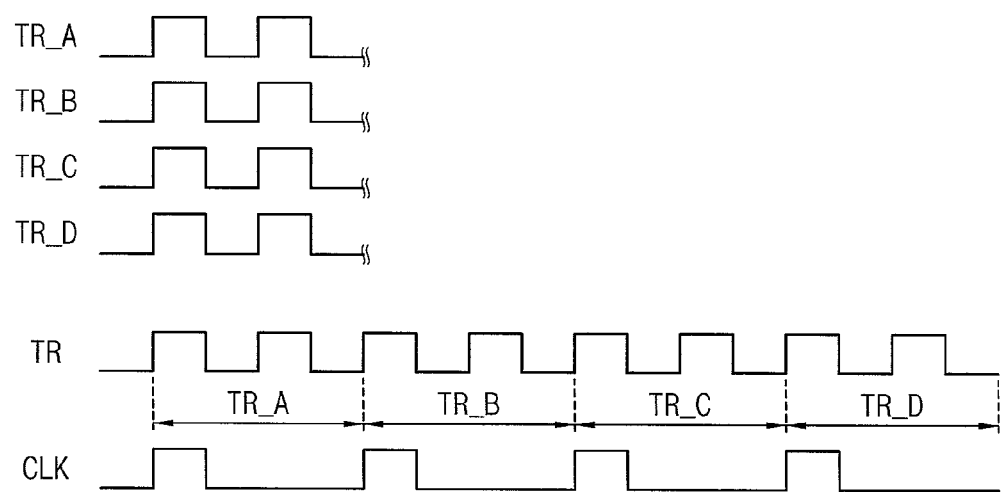
FIG. 9 is a timing diagram illustrating operation of the data buffer of FIG. 8, according to example embodiments.

FIG. 9 is a timing diagram illustrating operation of the data buffer of FIG. 8.

Referring to FIGS. 8 and 9, when the test result signals TR_A~TR_D are simultaneously provided to the serializer 83 from the semiconductor devices 200a, 200b, 200c and 200d, the serialzier 83 stores the test result signals TR_A~TR_D, serializes the test result signals TR_A~TR_D based on the clock signal CLK and outputs the test result signal TR sequentially. The clock signal CLK may be provided from the ATE and the serializer 83 may include a buffer that stores the test result signals TR_A~TR_D.

Figure 10:
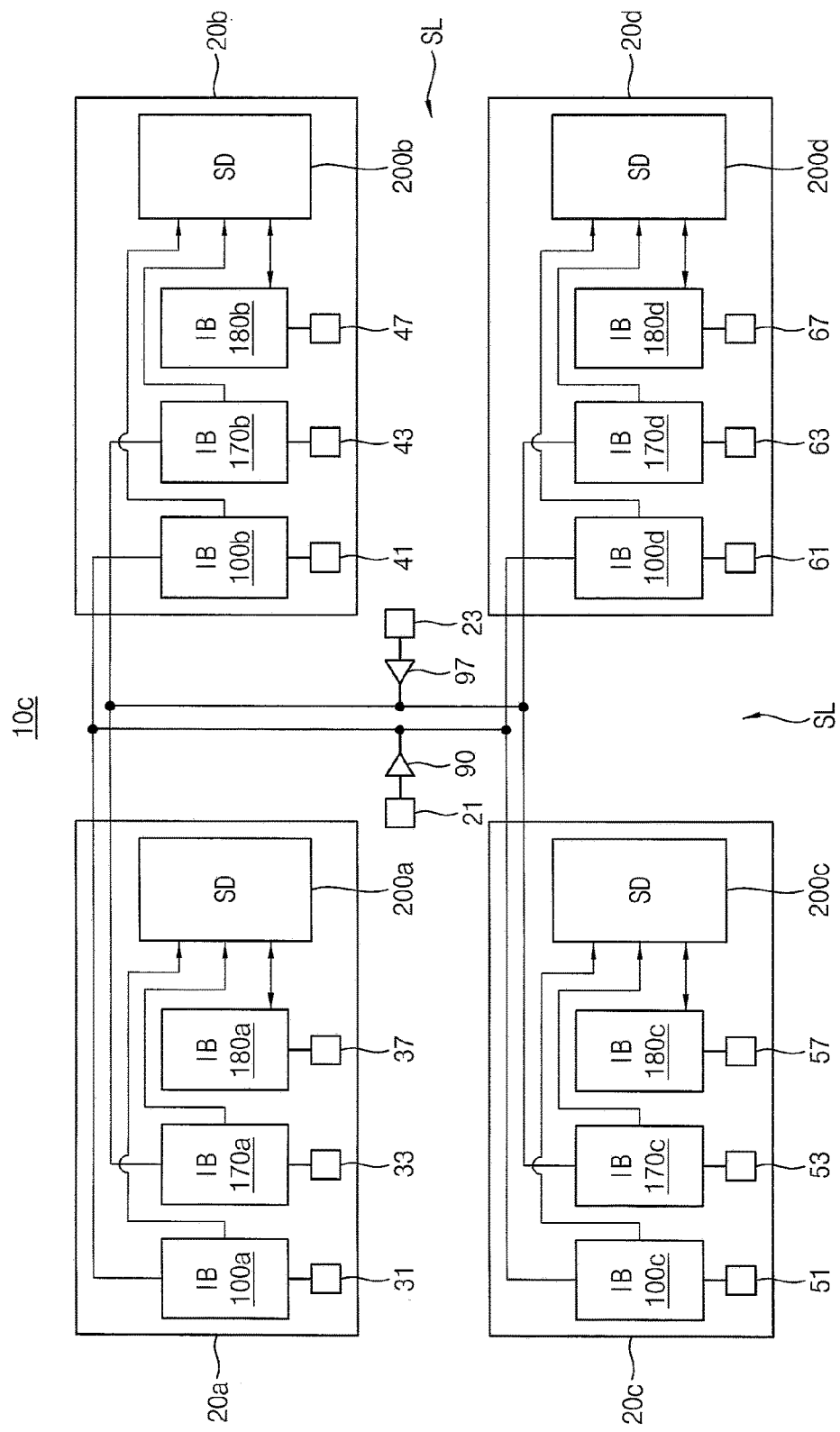
FIG. 10 is another enlarged plan view of a portion of FIG. 1, according to example embodiments.

FIG. 10 is another enlarged plan view of a portion of FIG. 1, according to example embodiments.

A portion 10c of the wafer W of FIG. 10 is different from the portion 10a of the wafer W of FIG. 2 in that drivers 90 and 97 are respectively connected to the common pads 21 and 23, an output of the driver 90 is commonly connected to the input buffers 100a, 100b, 100c and 100d and an output of the driver 97 is commonly connected to the input buffers 170a, 170b, 170c and 170d.

As illustrated in FIG. 2, the probe card 71 may contact the first common pad 21 and the probe card 73 may contact the second common pad 23.

When the wafer W is tested, the driver 90 drives the test operating signals from the common pad 21 and applies the test operating signals to the input buffers 100a, 100b, 100c and 100d. The driver 97 drives the test operating signals from the common pad 23 and applies the test operating signals to the input buffers 170a, 170b, 170c and 170d. When the drivers 90 and 97 drive the test operating signals, signal integrity from the ATE may be enhanced.

Although one driver 90 is connected to the first common pad 21 and one driver 97 is connected to the second common pad 23, two or more drivers may be connected to the first common pad 21 and two or more drivers may be is connected to the second common pad 23.

Figure 11:
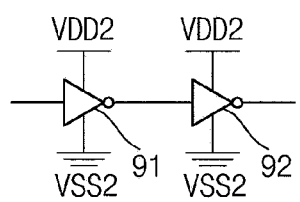
FIG. 11 illustrates a configuration of one of the drivers in FIG. 10 according to example embodiments.

FIG. 11 illustrates a configuration of one of the drivers in FIG. 10 according to example embodiments.

Referring to FIG. 11, a driver 90a may include inverters 91 and 92.

The inverter 91 has an input coupled to the first common pad 21 and is coupled to the inverter 92. The inverter 92 inverts an output of the inverter 91 to provide its output commonly to the input buffers 100a, 100b, 100c and 100d. The inverters 91 and 92 are provided with a supply voltage and a ground voltage from the second power pad VDD2 and the second ground pad VSS2 formed in the scribe lane SL and drive the test operating signals through the first common pad 21.

A configuration of the driver 97 in FIG. 10 may be substantially the same as the configuration of the driver 10a of FIG. 11.

Figure 12:
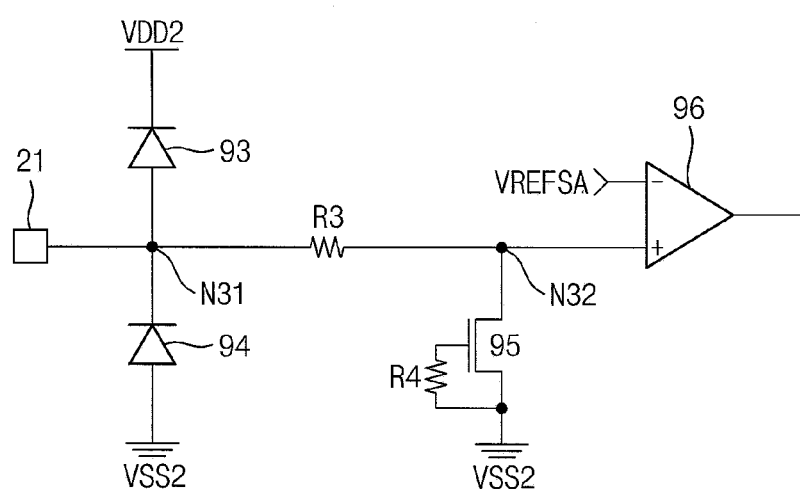
FIG. 12 illustrates a configuration of one of the drivers in FIG. 10 according to example embodiments.

FIG. 12 illustrates a configuration of one of the drivers in FIG. 10 according to example embodiments.

Referring to FIG. 12, a driver 90a includes diodes 93 and 94, a resistor R3, an NMOS transistor 133, a resistor R4 and an operational amplifier 96.

The diode 93 is connected between the second power pad VDD2 in the scribe lane SL and a node N31 connected to the first common pad 21, and the diode 94 is connected between the node N31 and the second ground pad VSS2. The resistor R3 is connected between the node N31 and a node N32. The NMOS transistor 95 is connected between the node N32 and the second ground pad VSS2 and the resistor R4 is connected between a gate of the NMOS transistor 95 and the second ground pad VSS2. The operational amplifier 96 has a positive input terminal connected to the node N32, a negative input terminal connected to a reference voltage VREFSA and an output terminal commonly connected to the input buffers 100a, 100b, 100c and 100d.

Therefore, the driver 90b may drive the test operating signal through the first common pad 21 with a voltage between the supply voltage of the second power pad VDD2 and the ground voltage of the second ground pad VSS2 when the wafer W is tested.

A configuration of the driver 97 in FIG. 10 may be substantially the same as the configuration of the driver 10b of FIG. 12.

In the embodiments above, in some implementations, test pads and part of conductive lines connected to the test pads are formed in the scribe lanes. The test pads may be connected to additional circuit elements, such as input buffers, drivers, or inverters. Some of those circuit elements may be in the scribe lane as well, such as the data buffer 80 of FIG. 7 or the drivers 90 and 97 of FIG. 10. The test pads, conductive lines, and additional circuit elements may be referred to as test circuits. The test pads and/or at least part of other items in the scribe lanes (e.g., part of the test circuits) may be removed and/or separated from other circuit elements during cutting of the wafer, which in some embodiments alters or prevents active operation of some remaining components originally connected to these components in the scribe lanes (e.g., the operation of input buffers may be altered). For example, the cut dies may include a partial test circuit, which is defined herein as an incomplete test circuit. For example, it may include a conductive test line that is not connected to any test pad, and may include other testing components not connected to any test pad.

According to these embodiments, for each die, input buffers (e.g., first, second, etc. input buffers) can be operated in a first manner during testing, and can be operated in a second manner different from the first manner normal operations after singulation. The difference in operating manners in some implementations is caused by the test architecture (e.g., because certain test circuitry that is part of the test architecture is cut and is altered or is not present in the singulated chip).

Figure 13:
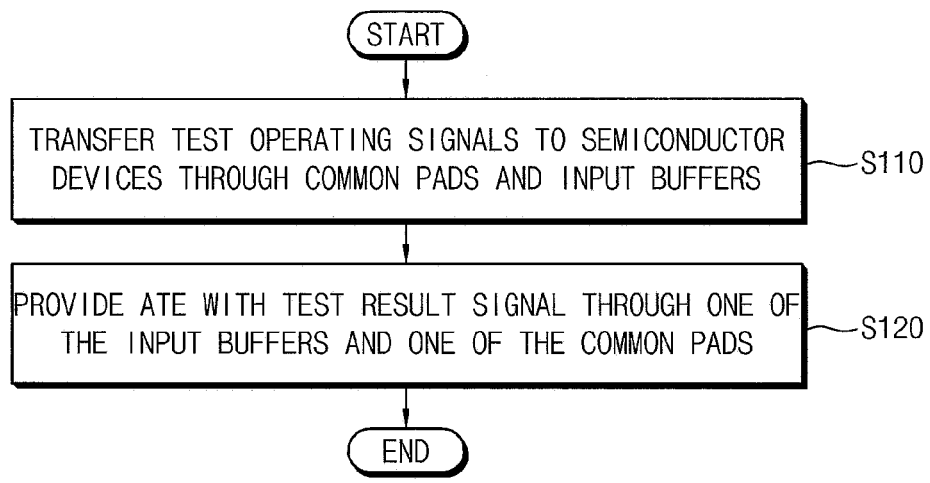
FIG. 13 is a flow chart illustrating a method of testing a semiconductor device at a wafer level, according to example embodiments.
Figure 14:
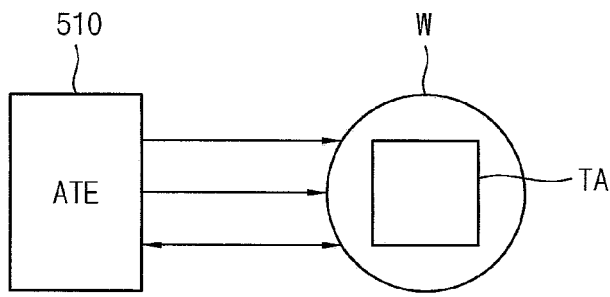
FIG. 14 is a block diagram illustrating a test system, according to example embodiments.

FIG. 13 is a flow chart illustrating a method of testing a semiconductor device at a wafer level and FIG. 14 is a block diagram illustrating a test system, according to example embodiments.

Referring to FIG. 14, a test system 500 includes a test architecture TA of a semiconductor device, formed in the wafer W and an ATE 510 that tests the test architecture TA of a semiconductor device.

The test architecture TA of a semiconductor device may include components associated with performing testing of the wafer W in FIGS. 2 through 12. The test architecture TA includes the common pads 21 and 23, the chip pads 31, 33 and 37, the input buffers 100a, 170a and 180a and the semiconductor device 200a, the chip pads 41, 43 and 47, the input buffers 100b, 170b and 180b and the semiconductor device 200b, the chip pads 51, 53 and 57, the input buffers 100c, 170c and 180c and the semiconductor device 200c, and the chip pads 61, 63 and 67, the input buffers 100d, 170d and 180d and the semiconductor device 200d in FIG. 2. The test architecture TA may further include the data buffer 80 in FIG. 7. The test architecture TA may further include the drivers 90 and 97 in FIG. 10. As such, the test architecture may include the various features described in the different implementations above that are present on the wafer before singulation. In this manner, a wafer may be formed to have a test architecture including certain test components dedicated solely to testing and other components that may be used either both for testing and for normal operation (e.g., after singulation), or only for normal operation.

Hereinafter, there will be a description of the method of testing a semiconductor device 200 at a wafer level with reference to FIGS. 1 through 14, according to certain example embodiments.

Referring to FIGS. 1 through 14, for testing the semiconductor devices 200a, 200b, 200c and 200d at a wafer level, which are formed respectively in the dies 20a, 20b, 20c and 20d on the wafer W, the ATE transmits the test operating signals to the semiconductor devices 200a, 200b, 200c and 200d through the common pads 21, 23 and 27 and the input buffers 100a, 170a and 180a, 100b, 170b and 180b, 100c, 170c and 180c, and 100d, 170d and 180d which are formed in the scribe lane SL that separates the dies 20a, 20b, 20c and 20d (S110). The ATE 510 transmits the command signal to the semiconductor devices 200a, 200b, 200c and 200d through the common pad 21, transmits the address signal to the semiconductor devices 200a, 200b, 200c and 200d through the common pad 23, and transmits the test pattern signal to the semiconductor devices 200a, 200b, 200c and 200d through the common pad 27 or the chip pads 37, 47, 57 and 67. Each of the semiconductor devices 200a, 200b, 200c and 200d provides the test result signal responding to the test pattern signal to the ATE 510 through the common pad 27 or each of the chip pads 37, 47, 57 and 67. The ATE 510 may determine whether each of the dies 20a, 20b, 20c and 20d is defective based on the test result signal.

Therefore, in a method of testing a semiconductor device, since the test operating signals are simultaneously applied to the dies 20a, 20b, 20c and 20d using the common pads 21, 23 and 27 formed in the scribe lane SL, an increase of time required for test may be prevented or reduced even when a number of dies formed in the wafer W increases.

Figure 15:
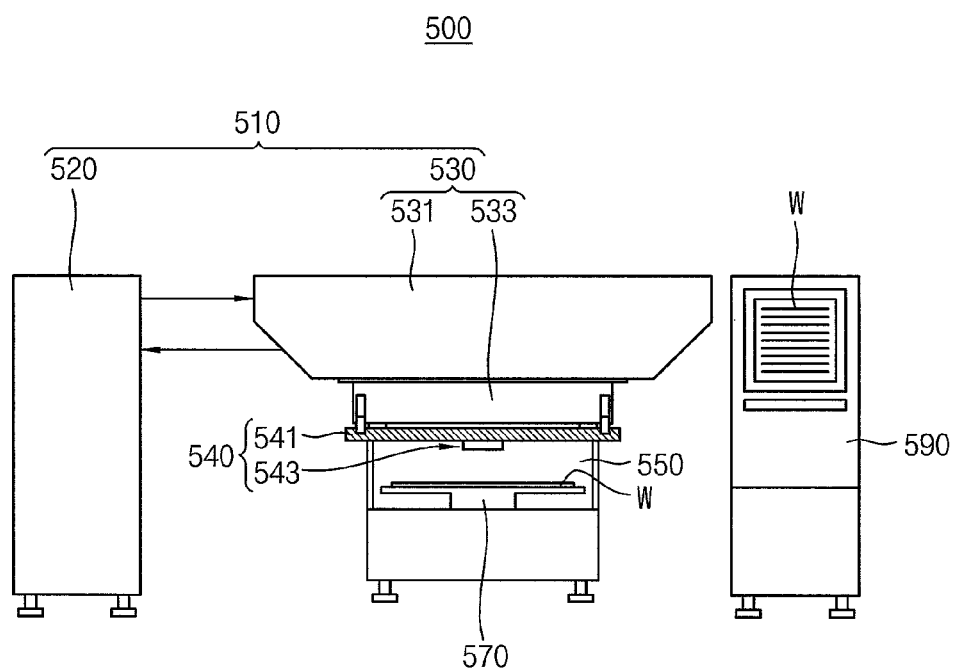
FIG. 15 illustrates the test system in detail.
Figure 16:
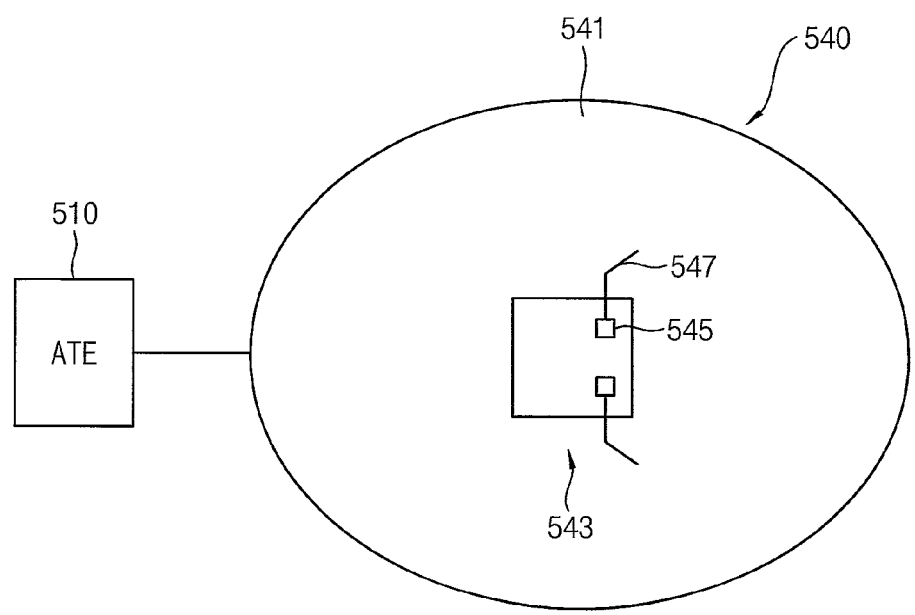
FIG. 16 illustrates a probe card in the test system of FIG. 15 in detail, according to example embodiments.

FIG. 15 illustrates the test system in detail and FIG. 16 illustrates a probe card in the test system of FIG. 15 in detail, according to example embodiments.

Referring to FIGS. 15 and 16, the test system 500 may include a probe card 540, a test chamber 550, the ATE 510, and a loader chamber 590. The ATE 510 includes a test head 530 and a test body 520, which are electrically connected via wires. Hereinafter, elements in the test system 500 will be described in detail with reference to FIGS. 1, 2, 14, 15 and 16.

The probe card 540 may include a substrate 541, and a probe unit 543. Since each size of the dies 20a~20d formed on the wafer W is small, it may be difficult to directly connect the ATE 510 that generates electrical signals to each of the dies 20a~20d. Therefore, the probe card 540 is used as a medium between the ATE 510 that generates the electrical signals and the wafer W on which each of the dies 20a~20d is formed.

The substrate 541 is shaped as a circular plate, and a plurality of male or female connectors may be formed on an upper surface of the substrate 541 in a circumferential direction of the substrate 541. By using the plurality of male or female connectors, the probe card 540 may be connected to the test head 300. For example, the substrate 541 may be a printed circuit board (PCB). Also, the substrate 541 may be referred to as a main circuit board.

The probe unit 543 may be attached to a side of the substrate 541, and may transmit the electrical signal received from the ATE 510 to each of the dies 20a~20d by wired connections. The probe unit 543 may include a plurality of pads 545 and a plurality of probes 547. The probes 547 may contact the common pads 21, 23 and 27, and transmit the electrical signal, i.e., at least one of an electrical power signal, a data control signal, and a data signal, that is received from the ATE 510 to the common pads 21, 23 and 27 by wired connections. The probe unit 543 may be removed from the probe card 540 after a test is finished.

The test chamber 550 provides a space for testing electrical properties of the dies 20a~20d. A wafer supporting chuck 570 that supports the wafer W may be disposed in the test chamber 550. The wafer supporting chuck 570 may support and raise and lower the wafer W. In particular, when a wafer W to be tested is disposed at a predetermined location during a test, the wafer supporting chuck 570 may raise the wafer W. Alternatively, when the wafer W to be tested is disposed at a predetermined location during the test, the wafer supporting chuck 570 may raise the wafer W such that the plurality of probes 547 on the probe card 540 and the plurality of common pads 21, 23 and 29 on the wafer W contact each other. When the test is finished, the wafer supporting chuck 570 may lower the wafer W.

A first side of the probe card 540, on which the plurality of probes 153 are provided, is disposed such that the first side of the probe card 540 faces an open portion of the test chamber 550. In the test chamber 550, the wafer W is disposed on the wafer supporting chuck 570 such that a side of the wafer W on which an integrated circuit is formed faces the probe card 540. When the wafer W is provided on the wafer supporting chuck 570, by using a flat zone of the wafer W, the common pads 21, 23 and 27 on the wafer W may be arrayed in an array direction of the probes 547 of the probe card 540.

When the common pads 21, 23 and 27 on the wafer W are arrayed below the probes 547 of the probe card 540 in a vertical direction, the common pads 21, 23 and 27 on the wafer W may physically and electrically contact the respective probes 547 of the probe card 540 as the wafer supporting chuck 570 is vertically raised and lowered.

The test head 530 may include a test head board 531 and a base 533. The test head board 531 configures a body of the test head 530, and may be shaped, for example, as a flat quadrilateral with inclinations at its sides in which a lower area is smaller than an upper area. However, a shape of the test head board 531 is not limited thereto. For example, the test head board 531 may be shaped as a regular flat quadrilateral plate with upper and lower areas of the same size, or a flat circular plate.

The base 533 is disposed at a lower surface of the test head board 531, and may have a ring shape in which the center is vacant. The probe card 540 may be coupled to a lower surface of the base 533. A structure of the base 533 may vary according to a shape of the probe card 540.

The test body 520 may generate an electrical signal for testing the dies 20a~20d, and may transmit the electrical signal to the dies 20a~20d on the wafer W via the test head 530 and the probe card 540. Also, the test body 520 may receive output signals, which are output from each of the dies 20a~20d in response to the electrical signal transmitted to each of the dies 20a~20d, via the probe card 540 and the test head 530, and thus determine whether or not each of the dies 20a~20d is faulty.

The loader chamber 590 is a space for storing the wafer W to be tested. In order to be tested, wafers W stored in the loader chamber 590 may be transferred one by one to the wafer supporting chuck 570 of the test chamber 590 by a moving device (not shown).

Figure 17:
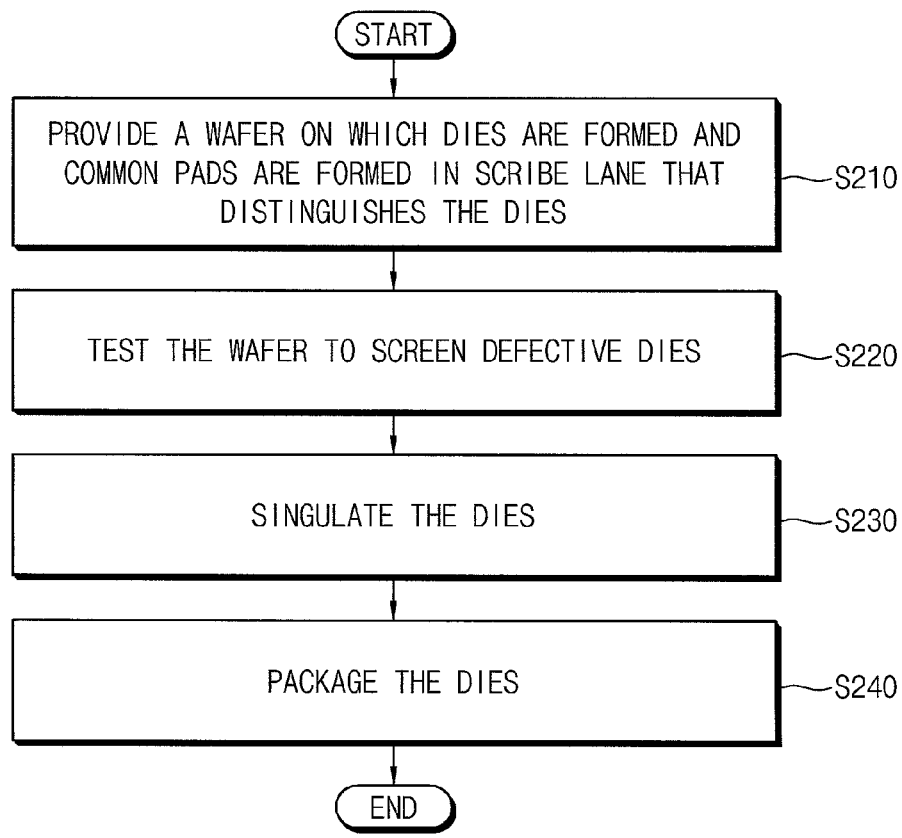
FIG. 17 is a flowchart illustrating a method of fabricating a semiconductor package according to example embodiments.
Figure 18:
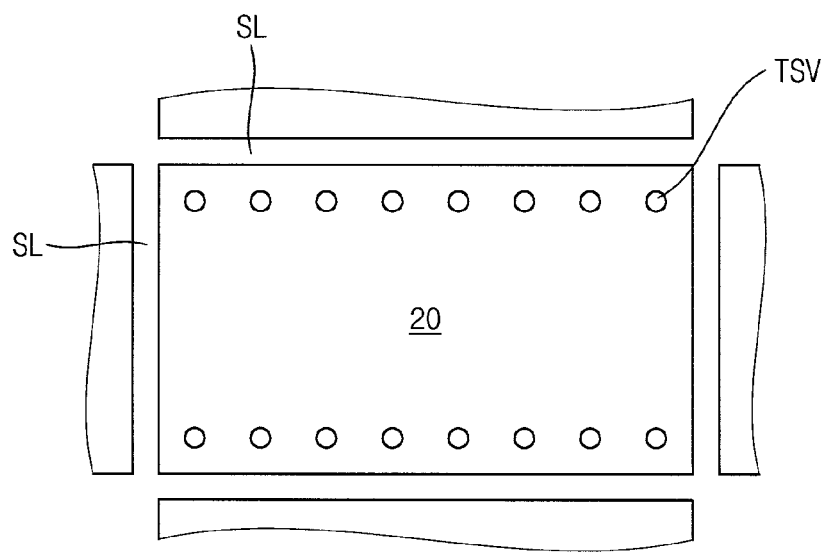
FIG. 18 is a plan view illustrating a semiconductor wafer according to example embodiments.
Figure 19:
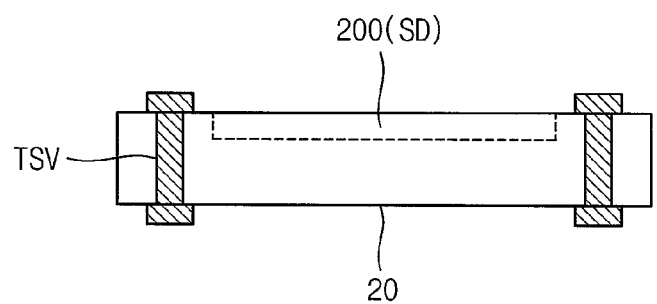
FIG. 19 is a sectional view illustrating a die formed on a semiconductor wafer according to example embodiments.
Figure 20:
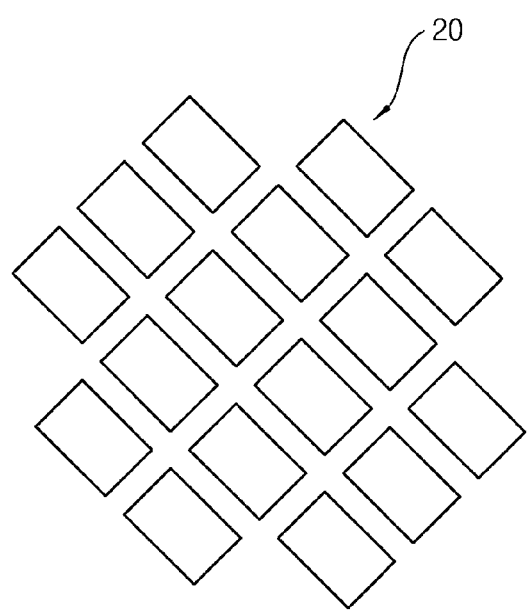
FIGS. 20 and 21 are perspective views illustrating a method of fabricating a semiconductor package according to example embodiments.
Figure 21:
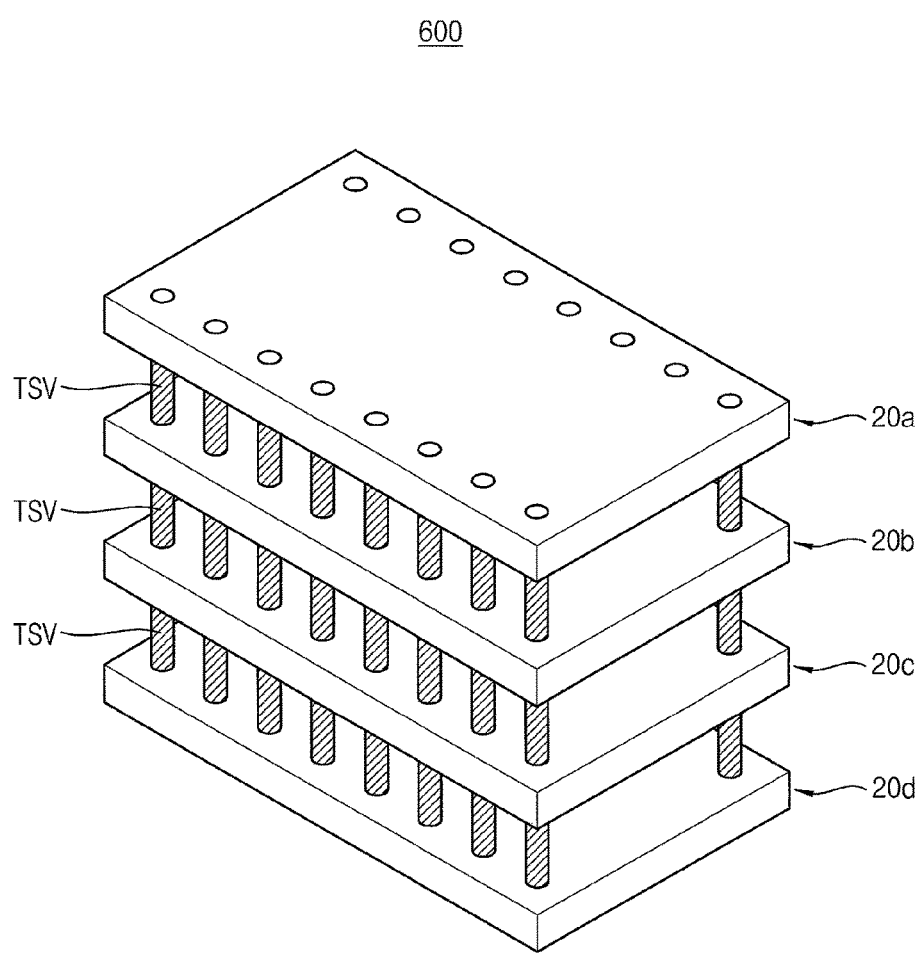
Figure 22:
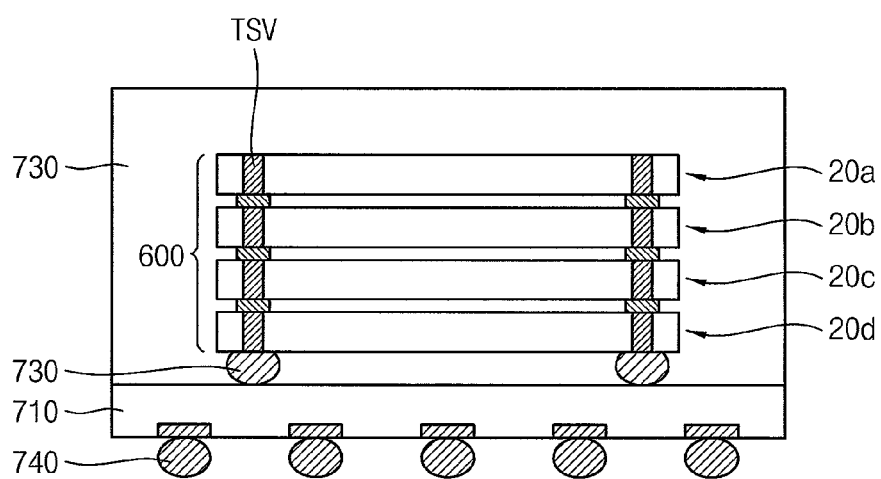
FIG. 22 is a sectional view illustrating a semiconductor package formed through a method of fabricating a semiconductor package according to example embodiments.

FIG. 17 is a flowchart illustrating a method of fabricating a semiconductor package according to example embodiments. FIG. 18 is a plan view illustrating a semiconductor wafer according to example embodiments. FIG. 19 is a sectional view illustrating a die formed on a semiconductor wafer according to example embodiments. FIGS. 20 and 21 are perspective views illustrating a method of fabricating a semiconductor package according to example embodiments. FIG. 22 is a sectional view illustrating a semiconductor package formed through a method of fabricating a semiconductor package according to example embodiments.

Referring to FIGS. 1, 2 and 17, there is provided a wafer W on which a plurality of dies 20a~20d are formed and at least a plurality of common pads 21 and 23 are formed in a scribe lane SL that separates the dies 20a~20d (S210). Each of the semiconductor devices 200a, 200d, 200c and 200d having respective functions may be formed in each of the dies 20a, 20b, 20c and 20d. The wafer W may have a test architecture.

Referring to FIGS. 18 and 19, each die 20 may include the semiconductor device 200 formed on a semiconductor substrate (e.g., a silicon substrate) and a through substrate via TSV (e.g., through silicon via, which may also be denoted as TSV) penetrating a semiconductor substrate to electrically connect to the outside. The semiconductor device 200 may include a semiconductor memory device such as DRAM, MRAM, and flash memory.

The through substrate via TSV (which may actually be a plurality of through substrate vias) may be disposed spaced apart from the semiconductor device 200, and may be electrically connected to semiconductor device 200 through a conductive pad (not shown). In an embodiment, the through substrate via TSV may be disposed at the edge of each of the dies 20, or may be arranged at the center portion of each of the dies 20. Moreover, the through substrate via TSV penetrating a semiconductor substrate may be surrounded by an insulating layer.

In certain embodiments, in the scribe lane SL that separates the dies 20, the common pads 21, 23 and 27, the data buffer 80 and the drivers 90 and 97 may be formed as described with reference to FIGS. 5 and 7 through 12.

Referring to FIGS. 17 through 19, the dies 20 are tested at a wafer level as described with reference to FIGS. 13 and 14, and a defective dies are screened of the dies 20 (S220). When the dies 20 are tested at a wafer level, test time may be reduced by providing the test operation signals simultaneously to the semiconductor device 200a, 200b, 200c and 200d through the common pads 21 and 23 and input buffers 100, 170 and 180 formed in each of the dies 20.

Referring to FIGS. 2, 17 and 20, the wafer W is cut with respect to the scribe lane SL and the dies 20 are separated (S230). For example, a sawing process is performed on the wafer W along the scribe lane SL and the dies 20 are separated. In this process, the test pads may be removed. In addition, part of test conductive lines may be removed. Further, part of a circuit such as part of a switching signal generator may be removed, which may change the operation and/or input to certain input buffers.

Referring to FIGS. 2, 17, 18 and 21, the dies 20a~20d are stacked. The dies 20a~20d may be bonded using an adhesive layer. As the dies 20a~20d are bonded, the through substrate vias TSV of formed in the dies 20a~20d may be connected to each other. For example, the through substrate vias TSV of FIG. 20 and FIG. 21 may contact each other or may be electrically connected to each other by using a solder bump. It should be noted that the dies used in individual packages can be prepared in different ways. For example, rather than using dies from the same wafer to form a stack, dies from different wafers can be combined to form a stack of chips for a package. For example, dies can be stacked at the wafer level, and then individual chip stacks can be formed by singulating the chip stacks from the wafer stack.

Referring to FIGS. 2, 17, 18 and 22, a packaging process may be performed on a semiconductor chip stack 600 including the stacked dies 20a~20d (S240).

The semiconductor chip stack 600 may be mounted on a package substrate 710. The semiconductor chip stack 600 may be mounted, for example, through a flip chip bonding method.

The package substrate 710 may include various kinds of substrates including, for example, a printed circuit board, a flexible substrate, and a tape substrate. According to an embodiment, the package substrate 710 may include a flexible printed circuit board including internal wires therein, a rigid printed circuit board, and a combination thereof.

The package substrate 710 has a top surface and a bottom surface, and includes bonding pads, connection pads, and internal wires. The bonding packages are arranged on the top surface of the package substrate 710, and may be electrically connected to the semiconductor chip stack 600 through bumps 720. For example, the bonding pads on the top surface of the package substrate 710 may be connected to the through substrate vias of the dies 20a~20d through the bump 720. The connection pads may be arranged on the bottom surface of the package substrate 710, and may be electrically connected to the bonding pads through the internal wires. Moreover, external connection terminals 740 (e.g., conductive bumps or balls such as solder balls) connecting a semiconductor package to an external electronic device may be attached to the connection pads.

Furthermore, the semiconductor chip stack 600 mounted on the package substrate 710 may be molded by a molding layer 730. The molding layer 730 may additionally form an underfill layer between the package substrate 710 and the semiconductor chip stack 600. The molding layer 730 may include, for example, an epoxy molding compound.

According to another embodiment, the semiconductor chip stack 600 including the stacked dies 20a~20d may be packaged in a chip scale. For example, external connection terminals 740 for connecting to an external device may be attached to the die 20d located at the lowermost layer among the semiconductor chip stack 600.

The semiconductor chip stack 600 may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A method of manufacturing a semiconductor chip from a wafer having a test architecture the method comprising:
    forming a plurality of dies on a wafer, each of the plurality of dies including a semiconductor device;
    forming at least two common pads commonly coupled to the dies, the at least two common pads being formed in a scribe lane, the scribe lane distinguishing the dies with respect to each other; and
    simultaneously testing the semiconductor devices at a wafer level, using the at least two common pads,
    wherein each of the dies comprises:
    a plurality of chip pads; and
    at least two input buffers, each coupled to one of the at least two common pads and one of the plurality of chip pads,
    wherein the at least two input buffers are configured to transfer to the semiconductor device therein, test operating signals through the at least two common pads and from an external automated test equipment.

2. The method of claim 1,
    wherein the at least two input buffers are further configured to cut off a path through at least a portion of the chip pads during testing of the semiconductor devices at a wafer level, and
    wherein the at least two input buffers comprise:
    a first input buffer coupled to a first common pad of the at least two common pads, a first chip pad of the plurality of chip pads, and the semiconductor device; and
    a second input buffer coupled to a second common pad of the at least two common pads, a second chip pad of the plurality of chip pads, and the semiconductor device.

3. The method of claim 2, wherein the first input buffer comprises:
    a switching circuit connected to the first common pad and a first ground pad in the die, wherein the switching circuit is configured to output one of a test operating signal through the first common pad and a ground voltage of the first ground pad in response to a first switching control signal and a second switching control signal;
    an internal driver connected to the first chip pad and the first ground pad; and a selection circuit connected to the switching circuit and the internal driver, wherein the selection circuit is configured to provide the semiconductor device with one of an output of the switching circuit and an output of the internal driver in response to the second switching control signal.

4. The method of claim 2, wherein the plurality of chip pads further comprises a third chip pad that is not connected to the common pads, and wherein the third chip pad is an input/output chip pad that receives the test operating signals from the external automated test equipment and outputs test result signals based on the test operating signals to the external automated test equipment during the semiconductor devices are tested at a wafer level.

5. The method of claim 2, wherein the at least two common pads further comprises a third common pad, wherein a data buffer connected to the third common pad is formed in the scribe lane, and wherein the at least two input buffers further comprises a third input buffer connected to the data buffer, a third chip pad of the plurality of chip pads, and the semiconductor device.

6. The method of claim 5, wherein the data buffer is configured to transfer, to each of the semiconductor devices through each of the third input buffers, a test pattern signal via the third common pad from the automated test equipment, and is configured to provide test result signal based on the test pattern signal from each of the semiconductor devices sequentially to the automated test equipment via the third common pad, during testing of the semiconductor devices at a wafer level.

7. The method of claim 2, further comprising:

at least two drivers formed in the scribe lane and connected to the at least two common pads respectively, wherein the at least two drivers are configured to drive test signals from the at least two common pads to provide the test signals to at least two input buffers in each of the dies respectively during testing semiconductor devices at a wafer level.

8. The method of claim 7, wherein the at least two drivers receive a power supply voltage and a ground voltage respectively from a power pad and a ground pad in the scribe lane.

9. The method of claim 3, wherein during testing of the semiconductor devices at a wafer level, the switching circuit outputs the test operating signal through the first common pad in response to the first switching control signal and the second switching control signal, and the selection circuit provides the semiconductor device with the output of the switching circuit in response to the second switching control signal.

10. The method of claim 3, wherein the switching circuit comprises:

a first transmission gate connected between the first common pad and a first node connected to the selection circuit, wherein the first transmission gate receives the first switching control signal and the second switching control signal; and a second transmission gate connected between the first ground pad and the first node, wherein the second transmission gate receives the first switching control signal and the second switching control signal.

11. The method of claim 10, wherein during testing of the semiconductor devices at a wafer level, the first switching control signal is enabled with a first logic level, the second switching control signal is disabled with a second logic level different from the first logic level, the first transmission gate is turned-on and connects the first common pad and the first node with respect to each other, and the second transmission gate is turned-off, in response to the first switching control signal and the second switching control signal.

12. The method of claim 3, wherein the test architecture includes, for each of the dies:

a switching signal generator, connected to a second ground pad in the scribe lane, configured to generate the first switching control signal and the second switching control signal.

13. The method of claim 12, wherein the switching signal generator is formed at least partially in the scribe lane.

14. The method of claim 12, further comprising:

during testing of the dies at the wafer level, enabling the first switching control signal with a first logic level and disabling the second switching control signal with a second logic level; and separating the plurality of dies with respect to the scribe lane after the semiconductor devices are tested at a wafer level, wherein the switching signal generator is configured to enable the second switching control signal with a first logic level and is configured to disable the first switching control signal with a second logic level after the separation.

15. A method of manufacturing a semiconductor chip, comprising:

providing a wafer including a plurality of dies including a first die used to form the semiconductor chip, and a plurality of test pads formed in scribe regions between the plurality of dies;

forming a plurality of test circuits connected to the plurality of test pads;

using the plurality of test pads and plurality of test circuits to simultaneously test the plurality of the dies;

singulating the dies from each other by cutting along the scribe regions, wherein the plurality of test pads and/or at least part of the plurality of test circuits are removed during the singulation and are not included in the singulated dies, and wherein each die includes a first input buffer connected to a first test pad, and further comprising:

for each die, operating the first input buffer in a first manner during testing, and operating the first input buffer in a second manner different from the first manner during normal operations after the singulation, wherein the difference in operating manners is caused by the test architecture.

16. The method of claim 15, wherein:

the first manner includes inputting a signal from test pads to the plurality of dies before singulation; and the second manner includes inputting a signal from chip pads to the plurality of dies after singulation.

17. The method of claim 15, wherein:

singulating the dies includes removing the test pads and cutting through part of a switching signal generator used to generate signals used to control testing of the plurality of dies.

18. A method of testing separate semiconductor devices formed in respective dies formed on a wafer at a wafer level, the method comprising:

transferring test operating signals from an external test equipment commonly to the semiconductor devices through a plurality of common pads and a plurality of input buffers connected to the common pads respectively; and providing test result signals from the semiconductor devices to the external test equipment through at least one of the input buffers and at least one of the common pads, in response to a test pattern signal of the test operating signals, wherein the common pads are formed in a scribe lane that distinguishes the dies with respect to each other and the common pads are connected commonly to the dies.

19. The method of claim 18, wherein for each die, the input buffers are configured to transfer the test operating signals through the common pads to the semiconductor device therein and are configured to cut off a path from a plurality of chip pads connected to the input buffers in the die, in response to switching control signals during testing of the semiconductor devices at a wafer level.

* * * * *